United States Patent [19]
Lazzari

[11] 3,945,038
[45] Mar. 16, 1976

[54] READ-WRITE MAGNETORESISTIVE TRANSDUCER HAVING A PLURALITY OF MR ELEMENTS

[75] Inventor: Jean-Pierre Lazzari, Villiers Saint Frederic, France

[73] Assignee: Compagnie Internationale Pour l'Informatique, Louveciennes, France

[22] Filed: Aug. 2, 1974

[21] Appl. No.: 494,177

Related U.S. Application Data

[63] Continuation-in-part of Ser. No. 315,476, Dec. 15, 1972, Pat. No. 3,848,217.

[30] Foreign Application Priority Data

Dec. 22, 1971  France .............................. 71.46103

[52] U.S. Cl. .................. 360/113; 324/46; 338/32 R
[51] Int. Cl.² ... G11B 5/12; G11B 5/30; H01C 7/16; G01R 33/02
[58] Field of Search ...... 360/113; 338/32 R; 324/46

[56] References Cited
UNITED STATES PATENTS

| | | | |
|---|---|---|---|
| 3,887,945 | 6/1975 | Nepela et al. | 360/113 |
| B371,787 | 1/1975 | Thompson | 360/113 |

*Primary Examiner*—Robert S. Tupper
*Attorney, Agent, or Firm*—Kemon, Palmer & Estabrook

[57] ABSTRACT

A read-write transducer for magnetic recording is made of two plural magnetoresistive layer flat structures contacting each other at first ends thereof and spaced apart at the opposite ends thereof and of a flat conductor coil winding having a front branch inserted between the said spaced apart ends of the structures. The magnetoresistive layers of the stacks are electrically interconnected in a read-out circuit and the winding may receive writing electrical currents. Each magnetoresistive layer in a stack is inserted between two thicker high permeability magnetic layers and all layers in a stack are relatively insulated.

3 Claims, 16 Drawing Figures

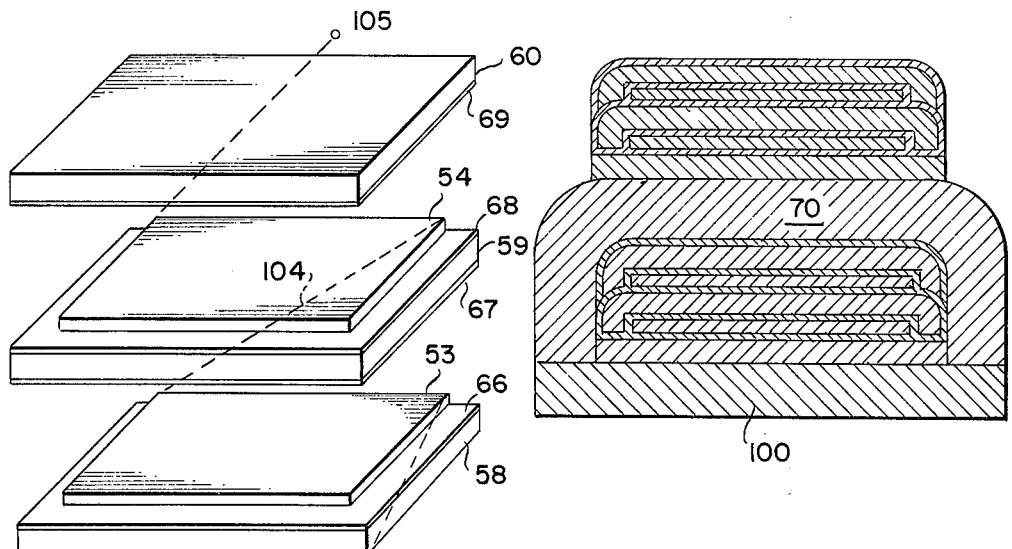
Fig. 15
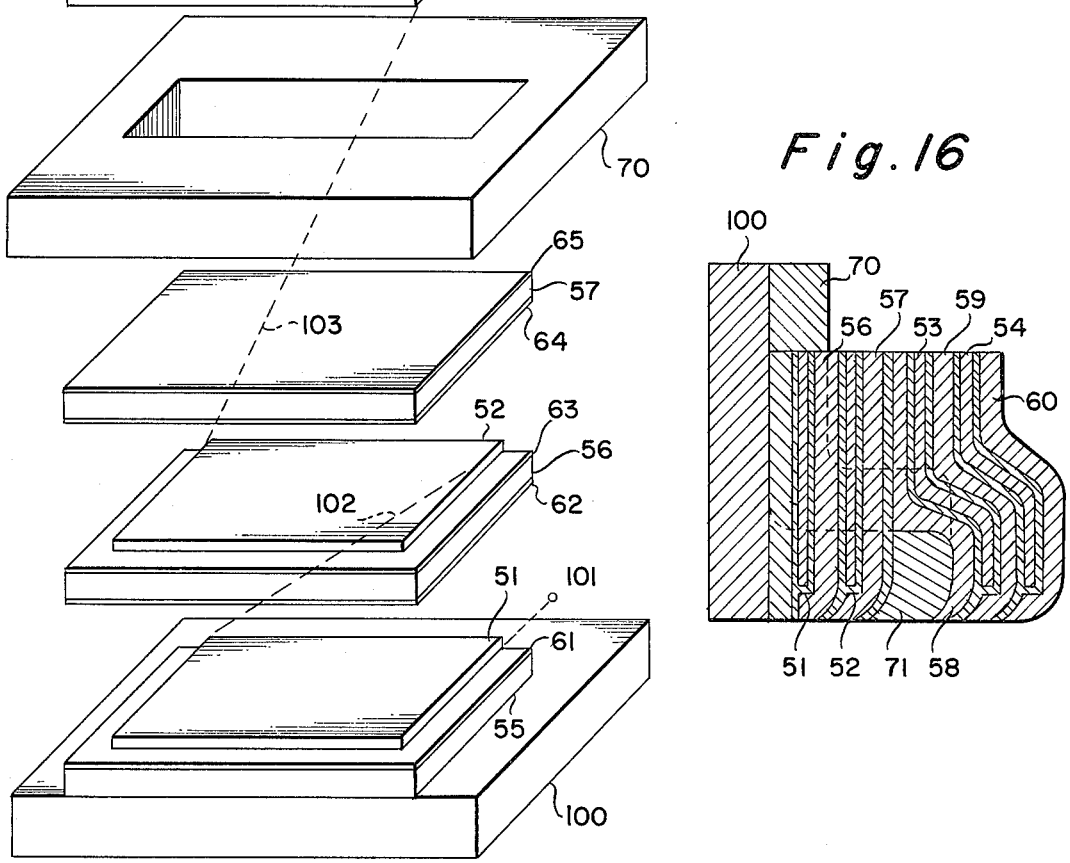
Fig. 16
Fig. 14

READ-WRITE MAGNETORESISTIVE TRANSDUCER HAVING A PLURALITY OF MR ELEMENTS

BRIEF SUMMARY OF THE INVENTION

The present invention is a continuation-in-part of co-pending application Ser. No. 315,476 filed Dec. 15, 1972 and now U.S. Pat. No. 3,848,217, by the same applicant, describing magnetoresistive devices comprising a layer of magnetoresistive anisotropic material, having an easy axis of magnetization at substantially 45° to the direction of electrical flow therethrough, a pair of thicker layers of high permeability magnetic material sandwiched around said magnetoresistive layer and each magnetoresistive and magnetic layers respectively to effect magnetostatic coupling between said magnetoresistive and magnetic layers.

Whereas such magnetoresistive devices may be used as readout transducers of magnetic records, as for instance disclosed in a paper of Robert P. HUNT in "IEEE Transactions on Magnetics" vol. MAG-7, No. 1, Mar., 1971, entitled "A Magnetoresistive Readout Transducer", they are improper to be directly used as writein transducers for magnetic recording purposes.

It is an object of the invention to provide a read-write transducer wherein such magnetoresistive devices are embodied as active members both for the reading and writing operations of the transducer.

The gist of the invention lies in the remark that, when no electrical read-out current is applied to a magnetoresistive device according to the parent specification, the structure may act plainly as a high permeability magnetic yoke plate.

A read-write transducer for magnetic recording according to the present invention comprises the combination, on an insulating surface of a substrate, a first stack of magnetoresistive layers each inserted in the stack between two thicker high permeability layers with interposition of insulating films between the facing surfaces of the layers, a flat conductor coil winding over a front portion of said first stack, one edge of which registers with one edge of said stack, and a second stack of magnetoresistive layers identical to the first over said flat conductor coil winding and the part of the first stack left exposed by the winding and also having an edge registering with the registering edges of the first stack and of the winding, all magnetoresistive layers of the stacks being electrically interconnected in a read-out circuit for the transducer, and said stacks acting as magnetic pole-pieces for the transducer when deprived of electrical current therethrough.

BRIEF DESCRIPTION OF THE DRAWINGS

FIG. 1 shows a side view of such a layer in the magnetic field, FIG. 2 defines the physical and geometrical parameters involved, and FIG. 3 shows the variation of the magnetoresistive factor of the layer with respect to the value of the external magnetic field;

FIG. 14 shows an exploded view of an example of embodiment of such a read-write transducer, FIG. 15 shows a transverse cross-section view of said embodiment, and, FIG. 16 shows a longitudinal cross-section view of this embodiment.

DETAILED DESCRIPTION

Figure 1:
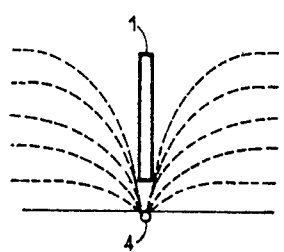
FIGS. 1 to 3 illustrate the behaviour of a magnetoresistive layer when an external magnetic field is applied to the layer.

In the drawings, 1 is a magnetoresistive layer 200 to 300 A thick, made of a Fe-Ni alloy such as the one commercially known as Permalloy, the easy magnetization of which is shown at A. Said magnetoresistive member 1 is fed with an electrical current I. When an external magnetic field M from a source of magnetic flux 4 is applied to the layer, this current will vary with the value of said field. The source of magnetic flux 4 is localized in that it has an elongated shape. Its breadth is substantially equal to the breadth of the edge of the layer 1 from which it is spaced at most a few microns. Its "thickness" may be assumed to be of the order of a few microns too. It must be understood that, in a recording equipment, the source 4 will travel parallel to its breadth and, as shown in the FIGS. the source 4 is at a position for which the response of the magnetoresistive layer is maximum.

Figure 2:
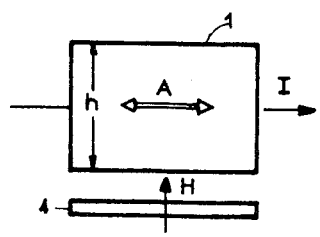
Figure 3:
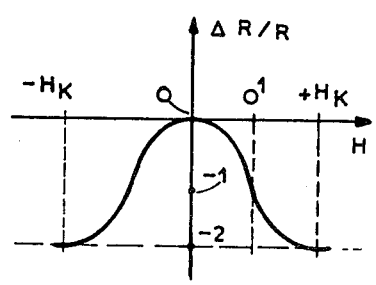
Figure 4:
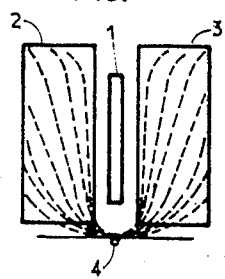
FIGS. 4 to 6 show views respectively corresponding to the views of FIGS. 1 to 3, applied to an improved magnetoresistive device according to the parent specification.

At normal ambient temperatures, the material of the layer exhibits a negative magnetoresistive effect $\Delta R/R$ of the order of 2%. In a conventional magnetoresistive device as shown in FIGS. 1 and 2, the easy axis A is substantially parallel to the direction of the flow of the electrical current I within the layer and the variation of the value of the magnetic field H is shown in FIG. 3. When the value of H reaches the value of the field of anisotropy of the material of the layer, $H_K$, the layer is saturated in the direction of its hard magnetization axis. In order to determine the direction of the applied external magnetic field, it is necessary to provide a shift of the zero of the ordinate axis from 0 to $0^1$ and the shift is conventionally ensured by applying an additional permanent magnetic field to the layer 1.

Figure 5:
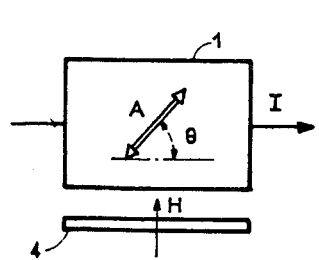
Figure 6:
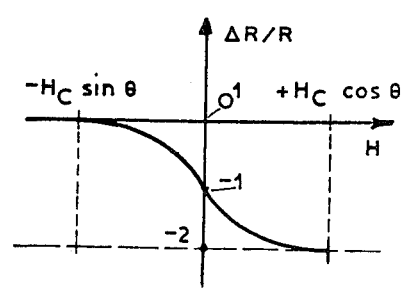
Figure 12:
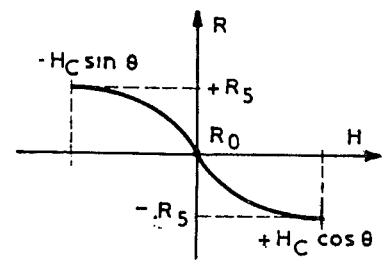
FIG. 12 shows the variation of the electrical resistance with the value of the external magnetic field in a magnetoresistive device according to the embodiments of FIGS. 7/8 and FIGS. 9:10.

A magnetoresistive device does not require such an additional and troublesome magnetic field when, as shown in FIG. 5, the easy axis of magnetization of the magnetoresistive layer 1 is inclined at an angle $\theta$ with respect to the direction of the flow of electrical current through the layer. The angle $\theta$ may advantageously be about 45°. The curve of variation of the magnetoresistive effect is as shown in FIG. 6. When the value of the external field H equals the value $H_c \cdot \cos \theta$, $H_c$ being the coercive field of the magnetic material of the layer 1, the magnetization in the layer is oriented perpendicular to the direction of the current I. When, on the other hand, $H = H_c \cdot \sin \theta$, the magnetozation of the layer is parallel to the direction of the electrical current I. FIG. 12 shows the corresponding variation of resistance of the magnetoresistive device, R, plotted against the variation of the magnetic field H. When H equals 0, the value of the resistance of the layer 1 is, for instance, Ro. When $H = -H_c \sin \theta$, the value of the resistance is $+R_s$ with respect to Ro. When $H = +H_c \cos \theta$, the value of the resistance is $-R_s$ with respect to Ro. It then suffices to take the value Ro as a reference value in any load circuit for the "signal" from the magnetoresistive member for obtaining both the value and the direction of the external magnetic field H to which the magnetoresistive layer is subjected.

The accuracy of the response of the magnetoresistive layer not depends only upon the magnitude of the magnetoresistive effect in the layer 1 but also, and more importantly, upon the uniformity of the rotation of the vector of magnetization in the layer in the direction of the "height" $h$ of the layer, FIG. 2. FIG. 1 shows in dotted lines the distribution of the lines of intensity of the magnetic field generated by the source 4 with respect to the layer 1 and it is apparent that the value of the field is not uniform along the height. Consequently, the rotation of the vector of magnetization will not be coherent throughout the layer and the response of the magnetoresistive device will be subject to substantial attenuation. As stated above, the value of the external field which produces a complete rotation of the magnetization in the layer is about equal to the value of the field of anisotropy of the material of the layer when the demagnetizing fields in the $h$ direction are small. When a localized source of magnetic field generates a field of a few hundreds of oersteds, which is quite normal for digitally recorded members such as tapes, discs or drums, or even such as "magnetic rules", the magnetoresistive layer is activated by an isofield line of a value substantially equal to 3 oersteds for the Fe-Ni alloy of the layer. Such a line is relatively far from the source 4 and consequently the localization of the source is very indefinite. The device could only to be used in a readout transducer if the magnetic record to read is of a low density of digits or marks. On the other hand it is desired to use such a magnetoresistive device for a readout of high density records such as records where the bits do not exceed a maximum width of 5 microns with magnetic domain intervals not exceeding 15 microns.

In order to eliminate such a drawback and, on the other hand, to greatly improve the accuracy of response of a magnetoresistive member, it is provided, as shown in FIG. 2, to arrange the magnetoresistive layer 1 between two high permeability layers 2 and 3 thicker than the layer 1. Preferably, though not imperatively, the layers 2 and 3 are made of anisotropic character. Each such layer may for instance have a thickness of at least 1000 A up to 5 microns or more, when the thickness of the layer 1 is between 200 and 300 A. Such layers as 2 and 3 are magnetostatically coupled to the magnetoresistive layer 1 and insulated therefrom by means of thin dielectric layers or films of a material such as $SiO_2$. Each dielectric film only need be a few hundreds of Angstroms in thickness.

More than one such layer as 2 or 3 may be provided on one side or on both sides of the magnetoresistive layer 1. When needed, a stack may be provided by placing one more magnetoresistive layer on the sides of the layers 2 and 3. Layers such as 2 and 3 are established over such additional magnetoresistive layers and so forth. Such a stack may be formed on a mechanically resistant substrate. The material of such layers as 2 and 3 may be the same as the material of the layer 1 when needed.

The layers 2 and 3, which are of high permeability due to their increased thickness, act as guiding members for the lines of intensity of the magnetic field from the source 4 so that the magnetoresistive layer 1 receives a substantially uniform magnetic field over its whole height, the magnetoresistive effect is optimized and the localizing of the source 4 occurs with a fair accuracy in the device. As the rotation of the magnetization vector is coherent within the layers 2 and 3, the rotation of the magnetization vector is also coherent and actually constant over the whole height of the layer 1 when the driving field H is of the same order of magnitude as the coercive field of the material of the layer 1. It may be said that the high permeability structure of the device acts as a magnetic field "transformer". The overall breadth of the magnetic structure defines the width of a "window" for localization of the source 4 with respect to the magnetoresistive device and the uniform magnetic flux applied to the layer 1 is maximum when the mid-plane of the source coincides with the vertical mid-plane of the device. Further, such a magnetoresistive device short-circuits any demagnetizing fields which may be generated by the magnetoresistive layer proper.

Figure 11:
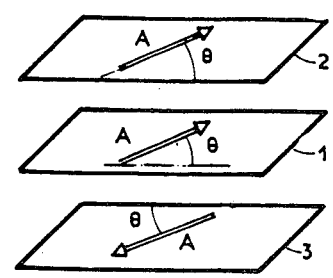
FIG. 11 shows an example of distribution of the directions of the easy axes of magnetization in the layers of an embodiment such as the one shown in FIGS. 9 and 10.

The presence of the high permeability layers further reinforces the action of the angular orientation of the axis of easy magnetization of the magnetoresistive layer with respect to the direction of the electrical current. As shown in FIG. 11, when no external magnetic field is applied to the device, the magnetization vectors of the layers 2 and 3 align on the easy magnetization axis of the magnetoresistive layer 1, one of them being however of opposite orientation from the two other ones, as shown for instance in the layer 3. When the external field is applied, the magnetization vectors of the layers 2 and 3 rotate by an angle depending on their thickness though this rotation is coherent throughout their heights. Because of the magnetostatic coupling existing between such layers 2 and 3 and the magnetoresistive layer 1, said rotation entails a rotation of the magnetization vector in the layer 1. From an adjustment of the thickness of the layers 2 and 3, the rotation may be made equal to the value of $\theta$.

The adjustment of the thickness of the layers 2 and 3 depends both of the physical parameters of the layers proper and of the corresponding parameters of the recording magnetic medium with which the device must be associated as a readout transducer of the record, E being the thickness of the layers and Br being the value of the remanent induction thereof, and $e$ being the thickness of the recording medium and $Br_o$ being the value of the remanent induction thereof, the adjustment is so made as to satisfy the following relation:

(i) $E \cdot Br \leq K \cdot e \cdot Br_o$, with $K$ being an efficiency coefficient which is depending upon the distance between the surface of the record and the facing surface of the magnetoresistive device when associated in a recording readout apparatus. When said distance is zero, $K = 1$.

The following table gives examples for which the rotation of the magnetization vector will be equal to 45° in the layers 2 and 3:

| Recording medium | | Layers 2 and 3 | |
| --- | --- | --- | --- |
| e ($\mu$) | Br$_o$ (gauss) | E ($\mu$) | Br (gauss) |
| 13 | 1,000 | 1,2 | 10,000 |
| 8 | 1,000 | 0.7 | 10,000 |
| 0.2 | 10,000 | 0.18 | 10,000 |
| 0.1 | 10,000 | 0.1 | 10,000 |

Figure 7:
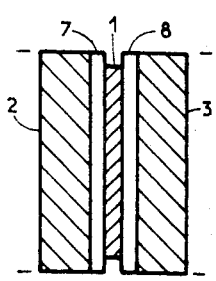
FIGS. 7 and 8 show, in respective orthogonal cross-section views, a first embodiment of such an improved magnetoresistive device, FIGS. 9 and 10 similarly show a second embodiment of such an improved magnetoresistive device.
Figure 8:
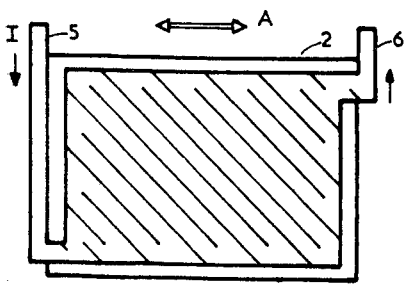

In the embodiment of FIGS. 7 and 8, the magnetoresistive layer 1 is made as a zig-zag layer the segments of which are slanted by 45° with respect to the lower edge of the layer 2 over which it is coated (with interposition of a dielectric film). The electrical input terminal is shown at 5 and the output terminal is shown at 6. The axis of easy magnetization of the material of the layer 1 is shown at A, parallel to the said edge and consequently at 45° with respect to the flow of electrical current through the magnetoresistive layer 1. The dielectric film between layers 2 and 1 is shown at 7 in FIG. 7, and a similar film 8 is present between the layers 1 and 3 in the same figure.

Figure 9:
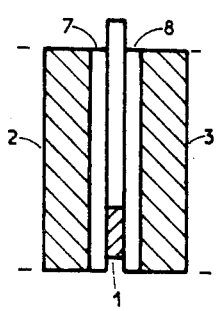
Figure 10:
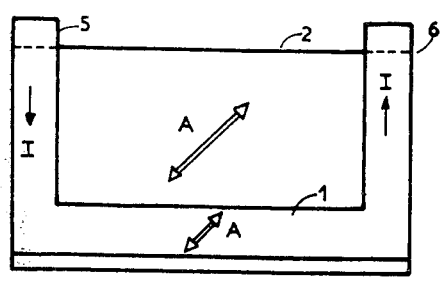

In the embodiment shown in FIGS. 9 and 10, the magnetoresistive layer 1 is shaped as a U-shaped layer the lower edge or branch of which is parallel to the edge of the layer 2. The axes of easy magnetization of the layers 1, 2 and 3 are shown in FIG. 10 and they are slanted by 45° with respect to said edge. Said axes are obviously at 45° of the direction of the flow of the electrical current, from 5 to 6, in the layer 1.

It must be understood that, in such embodiments, a mechanically resistant insulating substrate exists on one side of the structures. It must be noted that, in both embodiments, the magnetoresistive layer 1 is shown recessing from the edges of the layers 2 and 3 on the "airgap side" of the device. Such an arrangement provides a longer useful life for the transducer since, when the transducer operates in mechanical contact with the recording medium to read out information therefrom, the contacting edges of the layers 2 and 3 will first be the subject of the resulting mechanical erosion long before the corresponding edge edge of the magnetoresistive layer proper.

It is provided, according to the present invention, that such devices as described be embodied in read-write transducers because when no electrical current is applied to the magnetoresistive layers (which layers are electrically interconnected, e.g. in series relation when the device comprises a stack of such layers as hereinbefore explained), the device can plainly act as a high permeability flux concentrating magnetic yoke or flux return plate.

Figure 13:
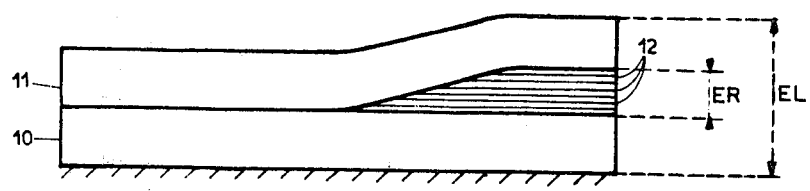
FIG. 13 shows a partial laterla view of a read-write transducer for magnetic recording, according to the present invention.

To this purpose, a read-write transducer broadly comprises, as shown in FIG. 13, in partial lateral cross-section thereof, two magnetoresistive devices, each comprising a stack of magnetoresistive layers with thicker high permeability layers interposed between them, as above described. Said devices or stacks, 10 and 11, are contacting each other at rear ends but the opposite ends of the stacks define an airgap within which is introduced a branch of a flat conductor winding coil. A more detailed embodiment of the structure of FIG. 13 is shown in FIGS. 14 to 16 incl.

The operation of the read-write transducer of FIG. 13 may be stated as follows:

during a read-out operation, the magnetoresistive layers of the stacks are fed with an electrical current and read the information on the recording medium with an airgap substantially equals to EL, during a write-in operation, no current is applied to the magnetoresistive members of the stacks but the writing current is applied to the winding 12 and the writing operation is ensured with a writing airgap ER. The stacks operate as pole-pieces for the writing "head".

The read-write transducer structure shown in FIGS. 14 and 16 illustrate a possible embodiment of the transducer of FIG. 13, with each stack restricted to two magnetoresistive layers for the sake of simplicity. The magnetoresistive layers, 51 and 52 for the lower stack (in FIG. 14) and 53 and 54 for the upper stack, are shown serially interconnected. The thicker layers of the first stack are shown at 55, 56 and 57, and the insulating films are shown at 61, 62, 63, 64 and 65 in said first stack. The flat conductor coil winding is shown as a block 70. The second stack comprises the thicker layers 58, 59 and 60 and the insulating films 66-67-68 and 69. The front branch 71 of the winding 70 inserts between the fore parts of the stacks and the rear part or branch of the winding is applied over the substrate, the lateral branches being warped as indicated in dash lines in the view of FIG. 16. When formed by successive depositions of the various layers of the structure, the cross-section in the transverse direction is shown on FIG. 15.

What is claimed is:

1. A read-write transducer comprising, on a substrate, the combination of:

a first stack of magnetic layers including at least two magnetoresistive layers and at least three thicker high permeability layers, each magnetoresistive layer being disposed between two of said thicker layers;

a second stack having the same number. and relative arrangement of magnetic layers as said first stack;

both stacks having rear parts contacting one another and having front parts spaced apart, forming a magnetic airgap therebetween;

a flat conductor coil having a front branch within said magnetic airgap and other branches extending from opposite ends of said front branch along the sides of said stacks and joined by a rear branch on said rear part of said stacks;

said magnetoresistive layers in said stacks being electrically interconnected, each of said magnetoresistive layers being of anisotropic material having an easy axis of magnetization at substantially 45° to the direction of electrical current flow therethrough.

2. Read-write transducer according to claim 1, wherein the magnetoresistive layers of the stacks have an edge recessed with respect to the adjacent edges of the thicker high permeability layers thereof.

3. Read-write transducer according to claim 1 wherein said rear branch of said coil is positioned on the substrate and said front branch is in a plane parallel to and spaced from said substrate.

* * * * *